United States Patent [19]

Urso et al.

[11] 3,998,538

[45] Dec. 21, 1976

[54] ELECTROMETER APPARATUS FOR REPRODUCTION MACHINES

[75] Inventors: Charles J. Urso, Webster; Charles D. Wilson, Pittsford; John E. Courtney, Fairport, all of N.Y.

[73] Assignee: Xerox Corporation, Stamford, Conn.

[22] Filed: Feb. 24, 1975

[21] Appl. No.: 552,019

[52] U.S. Cl. .................... 355/3 R; 324/32; 324/72; 355/14

[51] Int. Cl.[2] .................. G03G 15/00; G01R 31/02

[58] Field of Search ............... 355/3 R, 14; 324/72, 324/74, 32

[56] References Cited

UNITED STATES PATENTS 3,013,203 12/1961 Allen et al. .................. 324/72
3,782,818 1/1974 Smith .................. 355/3
3,852,668 12/1974 Hardenbrook et al. ............ 324/72

*Primary Examiner*—L. T. Hix
*Assistant Examiner*—J. A. LaBarre

[57] ABSTRACT

Apparatus to enable potentials applied to various operating components of an electrostatic type reproduction machine to be measured by an electrostatic voltmeter. In one embodiment, the apparatus comprises structures designed to place the sensing element of the voltmeter in predetermined spaced relationship with a test plate, the test plate being electrically connectable to the source of potential to be measured. In another embodiment, the apparatus locates the voltmeter sensing element in predetermined spaced relation with both the reproduction machine photoreceptor and the test plate.

As a further alternative, a source of calibrating potential is provided for use in calibrating the voltmeter through the test plate.

7 Claims, 7 Drawing Figures

ELECTROMETER APPARATUS FOR REPRODUCTION MACHINES

This invention relates to electrostatic reproduction machines, and more particularly to an improved apparatus for controlling machine operating potentials and service equipment calibration.

As will be readily understood by those familiar with copiers, the efficacy of electrostatic type copiers depends upon the proper relative charge being maintained between the photoconductive member and the developing means. For, as appreciated, this charge relationship or electrostatic development field is relied upon to attract the developing material, i.e. toner, from the supply source to the photoconductive member in conformance with both the outline and density of the electrostatic image on the photoconductive member. The electrostatic image which undergoes this development may be formed through the expediency of exposing the previously charged photoconductive member to a light image of the original being copied.

One method of sustaining the proper charge relationship between the photoconductive member and the developing means is to use an electrostatic voltmeter, commonly called an electrometer to sense potentials on the photoconductive member at some appropriate point. This device can be used as a service instrument to provide, by meter, a visible indication of the photoreceptor charge condition from which the electrostatic development field can be manually adjusted. In other cases, a feedback loop may be provided to enable the electrometer to automatically control the development field. Control over the electrostatic development field may be done, for example, by controlling or regulating the developer bias, or by controlling potentials on the photoconductor itself by regulating the corona charging means.

In machines of the type alluded to, adjustment of one or more of the various operating parameters, such as the developer bias, normally requires that the bias be identified, and changes made therein monitored. Failure to monitor the bias, and changes thereto, may result in biases exceeding safe or designed maximum levels with the consequent possibility of damage to the machine and danger to personnel operating the machine.

Further, electrometers, like most test instruments, require calibration checks from time to time to assure that the readings obtained are accurate. While numerous procedures exist in the prior art for calibrating such devices, many are limited to off-site locations using relatively complex and expensive equipment.

It is therefore an object of the present invention to provide a new and improved system for calibrating and using electrometers with electrostatic type reproduction machines.

It is a further object of the present invention to provide apparatus enabling the same electrometer to measure various operating voltages in an electrostatic reproduction machine.

It is an object of the present invention to provide a dual function device for use in calibrating an electrometer and measuring component potentials in addition to measuring the electrostatic charge on the photoreceptor of an electrostatic copier.

It is an object of the present invention to provide a calibration box for use in calibrating an electrostatic voltmeter.

It is a further object of the present invention to provide a housing for the probe element of an electrometer adapted to protect the probe element from damage and contamination, and expand the operational abilities of the electrometer.

It is a further object of the present invention to provide apparatus adapted to expand function of an electrostatic voltmeter and permit the voltmeter to measure operating bias potentials in an electrostatic copier in addition to corona generated charge potentials on the copier photoreceptor.

This invention relates to converter apparatus adapted to expand the function of an electrometer beyond measurement of the charge on the photosensitive member of an electrostatic type reproduction machine, comprising in combination; a first member adapted to support a test plate, the test plate being adapted to be electrically connected with a voltage source; a second member for supporting the electrometer probe; and means for assembling the first and second members together to form a unitary structure with the electrometer probe disposed in preset spaced relationship with the test plate so that a potential applied to the test plate evokes a signal indicative of the voltage potential on the test plate from the electrometer probe.

Other objects and advantages will be apparent from the ensuing drawings in which.

Figure 1:
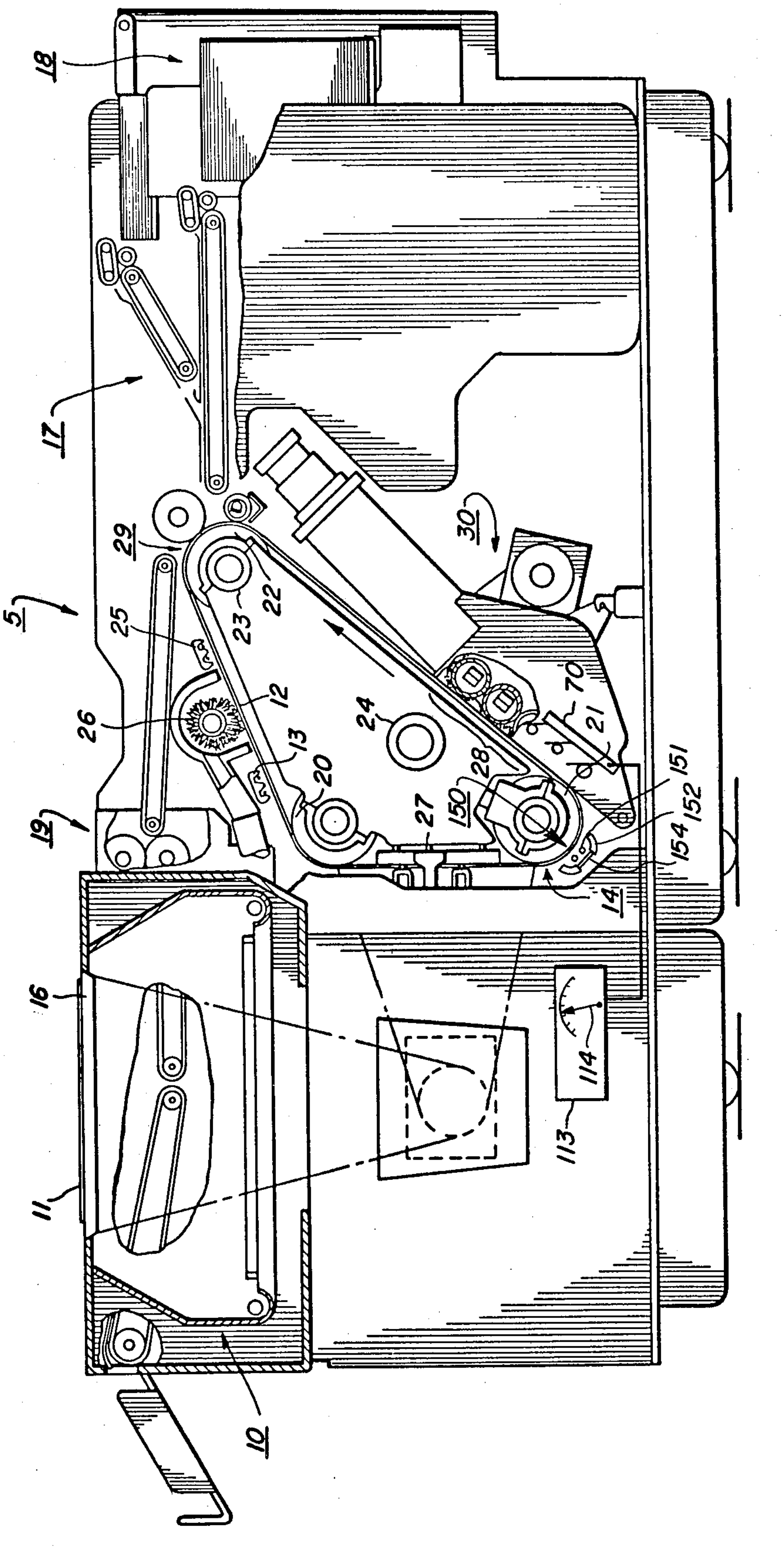
FIG. 1 is a schematic sectional view of an electrostatic reproduction machine incorporating the electrometer probe support of the present invention.

For a general understanding of the invention, an exemplary copier/reproduction machine in which the invention may be incorporated, is shown in FIG. 1. The reproduction or copying machine, is there designated generally by the numeral 5.

A document 11 to be copied is placed upon a transparent support platen 16 fixedly arranged in an illumination assembly, generally indicated by the reference numeral 10, positioned at the left end of the machine 5. Light rays from an illumination system are flashed upon the document to produce image rays corresponding to the information areas. The image rays are projected by means of an optical system onto the photosensitive surface of a xerographic plate in the form of a flexible photoconductive belt 12 arranged on a belt assembly, generally indicated by the reference numeral 14.

The belt 12 comprises a photoconductive layer of selenium which is the light receiving surface and imaging medium for the apparatus, on a conductive backing. The surface of the photoconductive belt is made photosensitive by a previous step of uniformly charging the same by means of a corona generating device or corotron 13.

The belt is journaled for continuous movement upon three rollers 20, 21 and 22 positioned with their axes in parallel. The photoconductive belt assembly 14 is slidably mounted upon two support shafts 23 and 24, with the roller 22 rotatably supported on the shaft 23 which is secured to the frame of the apparatus and is rotatably driven by a suitable motor and drive assembly (not shown) in the direction of the arrow at a constant rate. During exposure of the belt 12, the reflected light image of such original document positioned on the platen is flashed on the surface of the belt to produce an electrostatic latent image thereon at exposure station 27.

As the belt surface continues its movement, the electrostatic image passes through a developing station 28 in which there is positioned a magnetic brush developing apparatus, generally indicated by the reference numeral 30, and which provides development of the electrostatic image by means of multiple brushes as the same moves through the development zone, as more fully hereinafter described.

The developed electrostatic image is transported by the belt to a transfer station 29 whereat a sheet of copy paper or transfer member is moved between a transfer roller and the belt at a speed in synchronism with the moving belt in order to accomplish transfer of the developed image solely by an electrical bias on the transfer roller. There is provided at this station a sheet transport mechanism, generally indicated at 17, adapted to transport sheets of paper from a paper handling mechanism, generally indicated by the reference numeral 18, to the developed image on the belt at the station 29.

After the sheet is stripped from the belt 12, it is conveyed into a fuser assembly, generally indicated by the reference numeral 19, wherein the developed and transferred xerographic powder image on the sheet material is permanently affixed thereto. After fusing, the finished copy is discharged from the apparatus at a suitable point for collection externally of the apparatus. The toner particles remaining as residue on the developed image, background particles and those particles otherwise not transferred are carried by the belt 12 to a cleaning apparatus 26 positioned on the rim of the belt between rollers 20 and 22 adjacent a charge device 25. Further details regarding the structure of the belt assembly 14 and its relationship with the machine and support therefor may be found in U.S. Pat. No. 3,730,623 issued May 1, 1973 and assigned to the same assignee.

Figure 3:
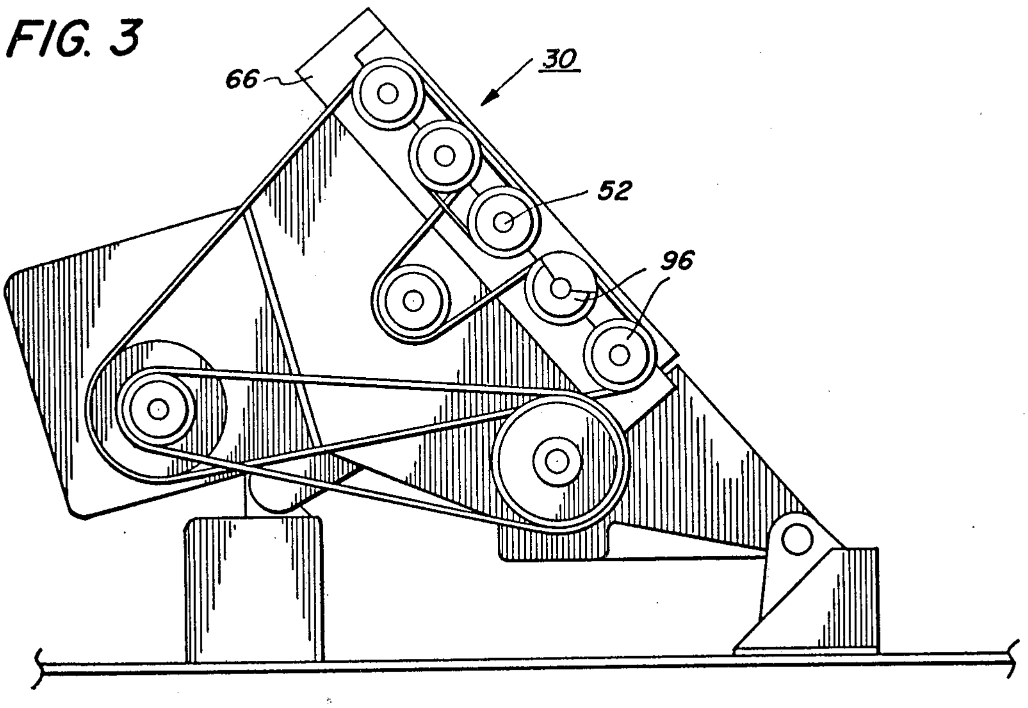
FIG. 3 is an elevational view of the opposite side of the magnetic brush developing assembly illustrating the drive mechanism for the magnetic brush roller apparatus.
Figure 2:
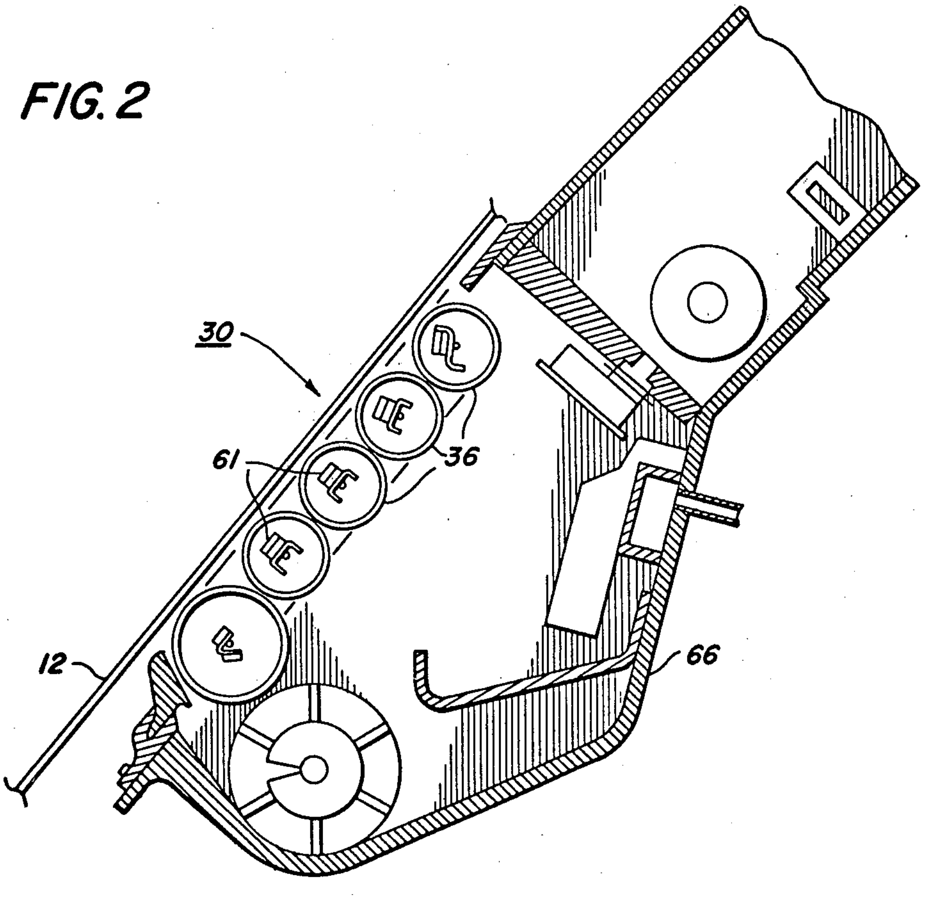
FIG. 2 is a side view of the magnetic brush developing apparatus shown in FIG. 1.
Figure 4:
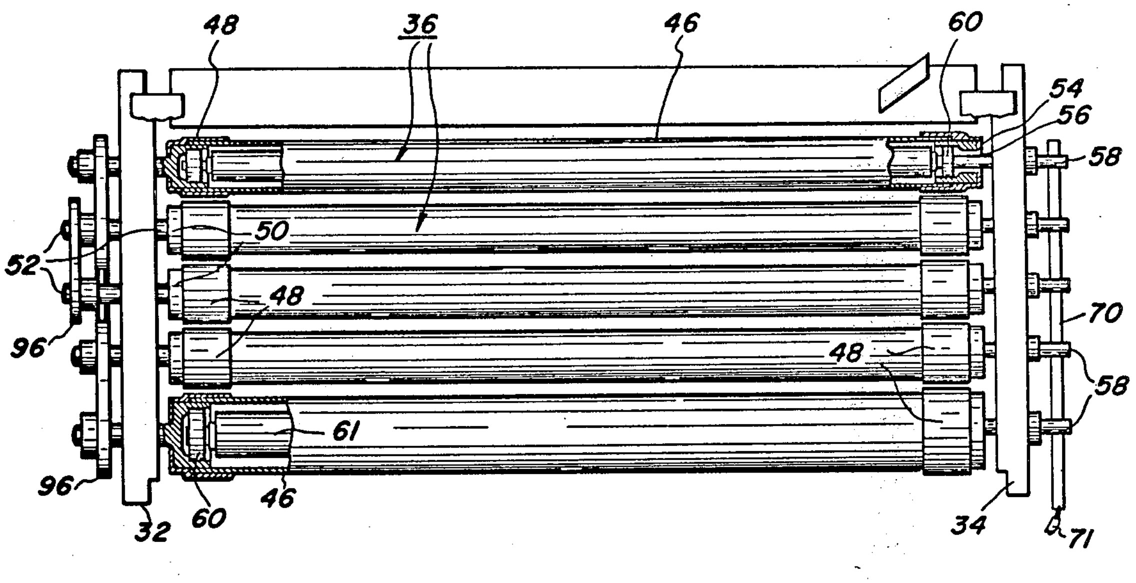
FIG. 4 is a top plane view of the magnetic brush assembly showing details of the brush bias applying mechanism.

Referring to FIGS. 2 through 4, there is illustrated a magnetic brush developing assembly, generally indicated as 30, comprising a series of rollers 36 rotatably supported in frame end plates 32, 34. The rollers 36 are each comprised of a cylindrical sleeve 46 of a roughened surface formed of a non-magnetizable material and extending almost the length of the housing of the developing apparatus 30. End sleeves 48, formed of an insulating material, are shrunk fit on the cylindrical sleeve 46 adjacent the ends thereof. One end of the sleeve 46 is closed by a cap 50 which supports a roller drive shaft 52 in coaxial alignment with the sleeve 46. The other end of the sleeve 46 is closed by a cap 54 having an orifice 56 through which extends shaft 58 of the internal bar magnets 61. Suitable bearing means 60 are provided to permit the sleeve 46 to rotate relative to shaft 58.

The roller drive shafts 52 are suitably mounted in bearings in end plate 32 and carry on their projecting ends drive sprockets 96. Sprockets 96 are formed of an insulating material.

Referring specifically to FIGS. 2 and 3, the magnet roller assembly 30 is disposed within a housing, generally indicated as 66, having a generally rectangular cross section and a length extending beyond the width of the photoconductive belt 12. Housing 66 is substantially closed except for an opening opposite photoconductive belt 12 whereat deveopment of the latent image on belt 12 is effected. Housing 66 in effect serves as a container for developing material comprising carrier beads from magnetizable material and colored electrostatic toner particles which adhere thereto.

To provide bias to magnetic brush rollers 36, a suitable wiper 70 is provided in electrical contact with magnet shafts 58, wiper 70 extending along and being supported by side plate 34 to form an electrical path through line 71 from an adjustable power supply 113 (seen in FIGS. 1 and 6) to each of the roller sleeves 46. Power supply 113 comprises any suitable source of electrical potential, herein designated in exemplary fashion as a battery. A suitable voltage output adjustment 114 is provided. While a d.c. power source is illustrated, an a.c. or combination a.c./d.c. may be used.

During development, the rollers 36 are rotated in unison in the same direction from a suitable drive source via sprockets 96, the internal bar magnets 61 remain stationary. The brush bristles produced by the influence of the magnetic field emanating from the bar magnets 61 acting upon the magnetizable carrier beads in the developing material will form on the upper region of the roller sleeves 46 adjacent the undersurface of the selenium belt 12.

This takes the form of a "magnetic blanket" extending continuously from one brush roller 36 to another for the entire width of the development zone 28 wherein the material is disposed or available to some degree for developing purposes. Further details regarding the formation and effect of the "magnetic blanket" are described in U.S. Pat. No. 3,640,248, issued on Feb. 8, 1972 and assigned to the same assignee.

As will be understood by those skilled in the art, development of the latent electrostatic image formed on belt 12 is dependent upon the voltage differential between the light image and the developing means. This voltage differential, which may be described as a xerographic development field, serves to attract toner to the latent electrostatic image in accordance with the image outline and density requirements to faithfully reproduce the original being copied. The strength and make-up of the xerographic development field may change with machine use and age.

To insure optimum machine performance, both initially and during the machine service life, adjustment or tuning of those machine processing components affecting the strength and make-up of the xerographic development field may be made. Such servicing may include adjusting of the power input to the corona generating device 13, re-setting the bias output of power supply 113 to magnetic brush sleeves 46, resetting the bias on the developing electrode or electrodes in an electroded developing system, etc.

The above adjustments may be performed manually and are normally performed by the machine technical or service representative may employ an electrostatic voltage measuring device, commonly termed an electrometer, and designated herein by the numeral 77.

Electrometer 77 measures the voltage or potential of an electrostatic charge on the surface, for example, the charge on the surface of belt 12 by means of a non-contacting probe 78, probe 78 being positioned in predetermined spaced relationship with the surface whose potential is to be measured for this purpose. Electrometer 77 may include a meter 77′ to indicate visually the voltage being read. Alternately, an automatic control may be provided wherein the output of the probe 78 to electrometer 77, reflecting the voltage level of the area measured, i.e., belt 12 is used to adjust the power input or bias to one or more of the machine process components such as described above.

Figure 5:
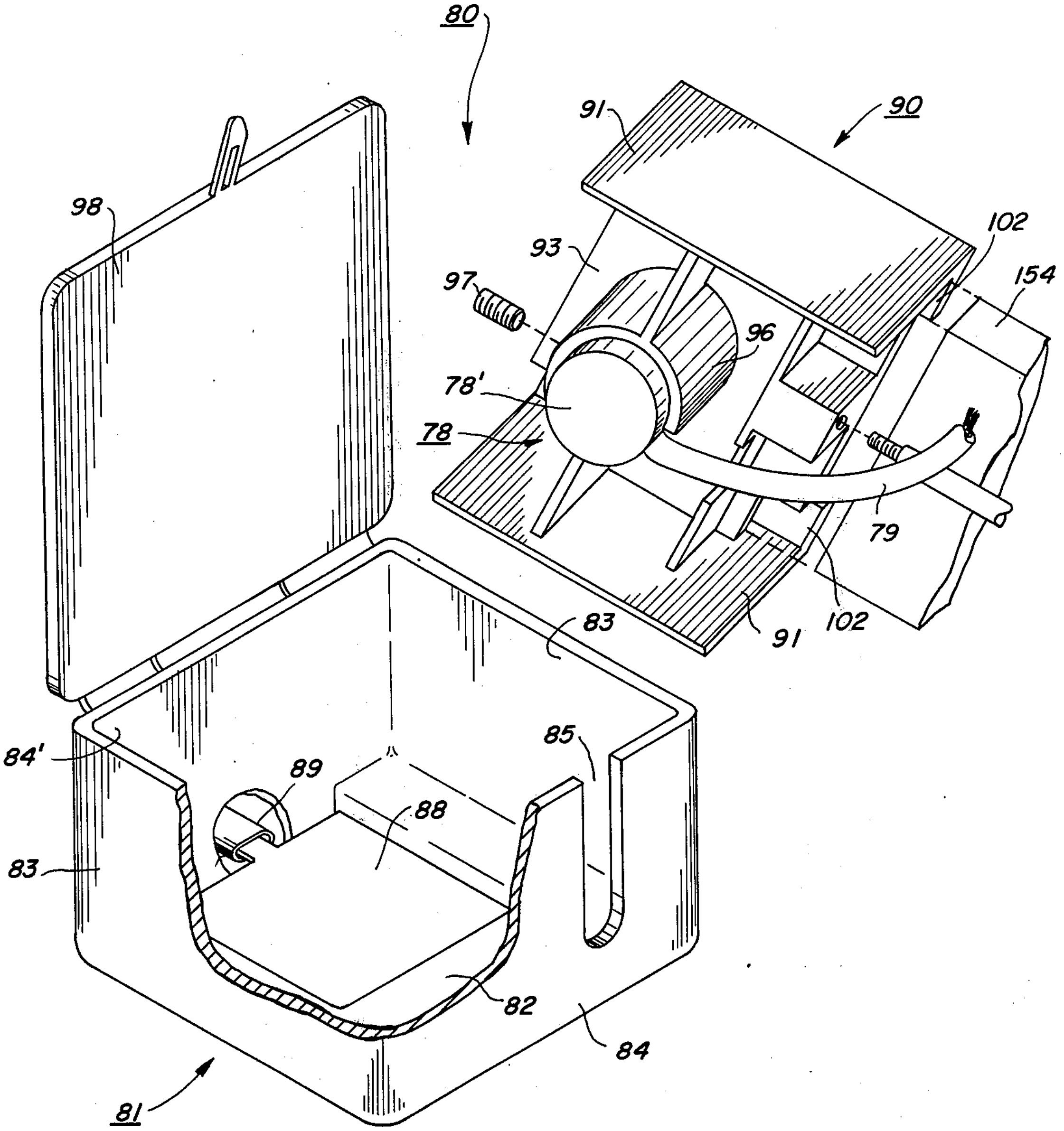
FIG. 5 is an isometric view showing details of the probe support of the present invention.

In servicing the reproduction machine 5 in the manner alluded to above, it is often desirable to know the voltage output of power supply 113 to the sleeves 46 of the magnetic brushes 36. To enable electrometer 77 to be used for this purpose, a voltage calibration box 80 illustrated in FIG. 5, is provided. Referring now to FIG. 5 box 80 includes an open generally rectangular block-like receptacle 81 within which a probe support 90 is insertable as will appear. Receptacle 81 includes a base 82 with upstanding sides 83, 84. Cover 98 is hingedly attached to one of the sides 84′.

One side 84 of receptacle 81 is slotted at 85 to accommodate cord 79 of electrometer probe 78. The depth of receptacle 81 is such as to limit insertion of probe support 90 therewithin through engagement with base 82. In this way, t he open side or face 78′ of probe 78 is set in correct spacing relationship with test plate 88 in receptacle 81 as will appear.

Test plate 88 comprises a generally rectangular metal piece, preferably brass, supported in fixed position on base 82 of receptacle 81. A test lead 89 projects from plate 88 through side 84′ of receptacle 81, lead 89 being utilized to couple test plate 88 with the voltage source to be measured as for example, magnetic brush power supply 113. Test lead 89 is electrically coupled to test plate 88 as by soldering.

Probe support 90 comprises a generally rectangularly shaped member having a central web portion 93 flanked on two sides thereof by vertical side walls 91, it being understood that the overall shape and dimension of probe support 90 is such as to permit the probe support to be snugly inserted within receptable 81 with the lower edge of walls 91 abutting against base 82 of receptacle 81.

Web 93 of probe support 90 is provided with a circular receptacle 96 dimensioned to receive probe 78 of electrometer 77 therewithin. Suitable means, such as set screw 97, is provided to retain probe 78 in receptacle 96 and in preset spaced relationship with test plate 88 when probe support 90 is assembled with receptacle 81.

In use, probe 78 is secured within receptacle 96 of probe support 90. Support 90 is then inserted into receptacle 81 until walls 91 thereof contact base 82 of receptacle 81. This locates face 78′ of probe 78 in preset spaced relationship to test plate 88. Cover 98 may then be closed to retain the parts in assembled relationship and provide a unitary calibration box 80.

Test lead 89 is connected to the bias source to be measured, as for example, power supply 113 for magnetic brushes 30. For this purpose, a suitable switching mechanism such as the switching mechanism 98 shown in FIG. 6 may be provided to couple through switch contact 101 power source 113 to test plate 88. The resulting potential appearing on test plate 88 is read by probe 78, the voltage reading appearing on meter 77′ of electrometer 77. As will be understood this reading indicates the voltage bias of power supply 113 to magnetic brush sleeves 46 and serves as a reference when adjustments to the voltage supply are made.

It will be understood that bias to the reproduction machine component being measured, for example, magnetic brushes 36, may be interrupted during measurement. In that circumstance, an additional switch contact or switching mechanism (not shown) would be provided to interrupt the circuit from power supply 113 to brush sleeves 46 during measurement.

It is sometimes desirable to calibrate electrometer 77, to insure accuracy in the voltage readings provided. For this purpose, a source of known potential such as battery 100 is provided. Battery 100 is coupled to test plate 88 through lead 89 to provide a preset potential, and the ensuing reading of meter 77′ of electrometer 77 compared with the known potential of battery 100. For this purpose, a second switch terminal of the afore-described switching mechanism such as terminal 103 of mechanism 98 may be set to couple battery 100 with test plate 88. Switch terminal 103 is coupled to calibration battery 100 by lead 104.

It will be understood that voltage calibration box 80 may be utilized to check other biases within the machine 5.

Referring now to FIGS. 1 and 5, reproduction machine 5 includes a fadeout lamp assembly 150 having lamp pair 151 disposed within reflector housing 152 between exposure station 27 and developer station 28. As understood by those skilled in the art, lamps 151 function to fadeout or erase unwanted margin edges of the latent electrostatic image on belt 12.

Lamp assembly 150 is slidably supported by a plate 154 for movement of the assembly into and out of operative position opposite belt 12. This construction permits the lamp assembly 150 to be removed for servicing and replacement.

Where it is desired to measure voltage condition on belt 12, lamp assembly 150 may be removed, and probe support 90 together with probe 78 mounted therewithin inserted onto plate 154. For this purpose, edges 102 of probe support 90 are turned in to enable the probe support 90 to be slidably disposed upon plate 154 thereby locating probe 78 in proper spaced relationship with belt 12 for accurate measurement of the potential thereof. For this purpose, the relative dimensions of plate 154 and probe support 90 are selected so as to provide the requisite mounting for support 90 yet permit slidable movement along plate 154.

Figure 6:
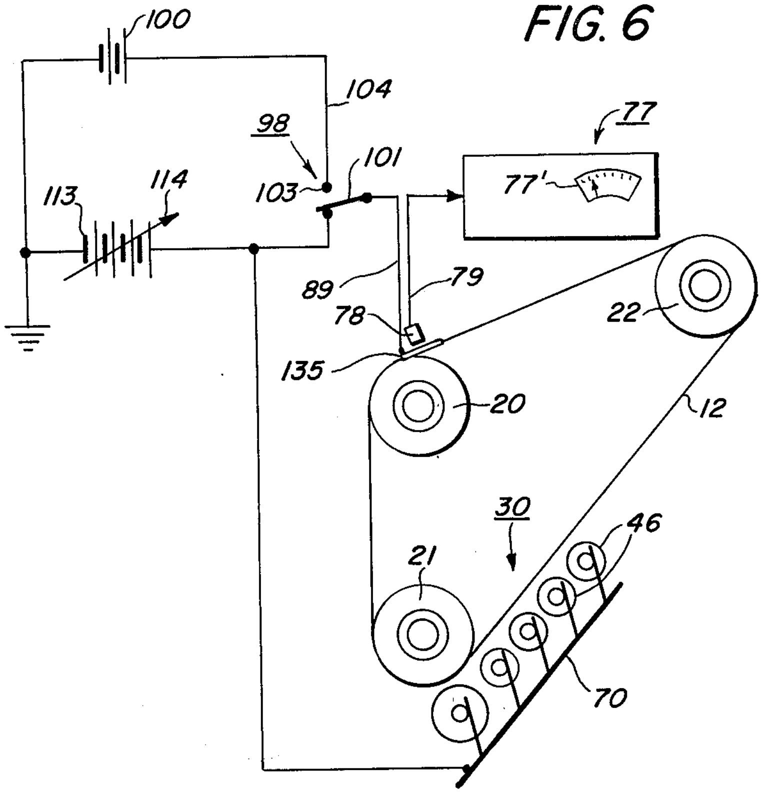
FIG. 6 is a schematic view of an operating circuit for use with the probe support of the present invention.
Figure 7:
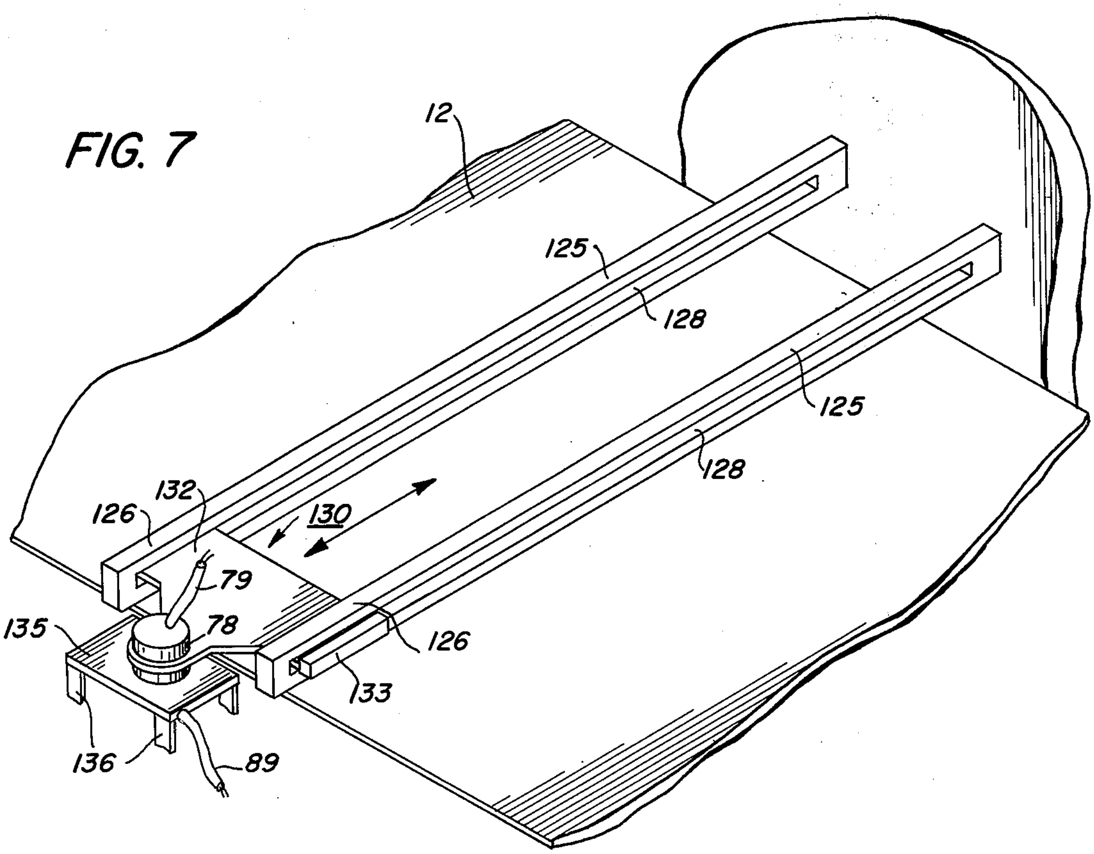
FIG. 7 is an isometric view of an alternate probe support arrangement.

In the embodiment shown in FIGS. 6 and 7, where like numerals refer to like parts, electrometer probe 78 is supported in preset spaced relationship with the photosensitive surface of belt 12 for slidable movement transversely back and forth thereacross. For this purpose, a pair of slotted supports 125, are provided, supports 125 being suitably mounted on adjoining frame members (not shown) of reproduction machine 5 so that slots 128 therewithin form a pair of parallel tracks a preset distance above the surface of belt 12. The longitudinal extent of supports 125 and slots 128, are such that a portion 126 of each support 125 and the slots 128 therewithin extend sufficiently to locate probe 78 over test plate 135 adjoining one side of belt 12.

Probe 78 is fixedly attached to a carriage 130, carriage 130 having a pair of oppositely extending arms 132 extending in and slidable within slots 128. Suitable locking caps 133 may be provided on the terminal ends of arms 132 to prevent arms 132 from slipping out of slots 128 as carriage 130, together with probe 78, is moved along slots 128.

A calibration/bias test plate 135 which is preferably made of brass, is supported by legs 136 adjacent one side of belt 12 adjacent the extended portion 126 of supports 125. The dimension of the supporting legs 136 is such that test plate 135 is parallel to the path followed by electrometer probe 78 and spaced a preset distance therebelow. To prevent short circuiting or dissipation of any bias applied to test plate 135, supporting legs 136 are comprised of a suitable electrical insulating material.

Referring to FIGS. 6 and 7, the electrometer probe support there described together with test plate 135 are preferably built-into the reproduction machine 5 to form a relatively permanent installation at a selected point along the photoreceptor belt 12. One suitable location is between corona charging device 13 and exposure station 27.

In use, probe 78 is electrically connected to electrometer 77 by cord 79, and readings of the voltage potential on the photosensitive surface of belt 12 are obtained. Conveniently, by moving carriage 130 back and forth along slots 128, probe 78 can be made to scan the surface of belt 12 to provide readings across the entire width of belt 12 as desired.

Where it is desired to take a reading of the voltage potential on test plate 135, as for example where checking and/or adjusting bias to sleeves 46 of mag brushes 36, plate 135 is electrically connected to the voltage source, i.e., power supply 113, by switching mechanism 98 in the manner described heretofore. Carriage 130 together with probe 78 may be moved along slots 128, to a point opposite test plate 135 and the desired reading taken.

While the invention has been described with reference to the structure disclosed, it is not confined to the details set forth, but is intended to cover such modifications or changes as may come within the scope of the following claims.

What is claimed is:

1. Apparatus adapted to expand the function of an electrometer beyond measurement of voltage charges on the photoreceptor of an electrostatic type reproduction machine, said electrometer having a remote probe for sensing voltages on a surface, the combination comprising:

a test plate adapted to bear voltages to be measured;

means supporting said test plate in adjoining spaced relationship with said photoreceptor;

means forming a track for said probe extending over surface portions of both said test plate and said photoreceptor, said track being adapted to place said probe in predetermined spaced relationship with said surface portions to enable said probe to respond to voltages thereof; and means for movably mounting said probe in said track whereby to permit said electrometer to measure voltages on both said test plate and said photoreceptor.

2. Apparatus according to claim 1, in which said reproduction machine includes developing means for developing latent electrostatic images formed on said photoreceptor, said developing means including at least one developing element adapted to carry a preset voltage bias together with a voltage source to provide said bias, and circuit means to couple said voltage source with said test plate whereby to permit said bias voltage to be measured by said electrometer.

3. Apparatus according to claim 1, including a source of preset voltage for use in calibrating said electrometer, and circuit means to couple said voltage source with said test plate to permit calibration of said electrometer therefrom.

4. In an electrostatic reproduction machine for providing copies of originals including a movable photoreceptor, means to charge said photoreceptor in preparation for imaging, exposure means to selectively discharge said photoreceptor in accordance with the original being copied to form a latent electrostatic image on the photoreceptor, and means to develop the latent electrostatic image, the developing means including at least one developer element adapted to bear an electrical bias, and voltage producing means for placing an electrical bias on said developer element, the combination of:

measuring means to determine the plate voltage on a surface without contacting said surface, said measuring means including a probe adapted for disposition adjacent said surface, means to position said probe a preset distance from said surface whereby said probe produces a signal reflecting the plate voltage of said surface, means for coupling said surface to said voltage producing means whereby to determine the voltage output of said voltage producing means with said measuring means, and a source of known voltage for use in calibrating said measuring means, said coupling means being adapted to couple said known voltage source with said surface whereby to enable said measuring means to be calibrated with said known voltage source.

5. In an electrostatic reproduction machine for providing copies of originals including a movable photoreceptor, means to charge said photoreceptor in preparation for imaging, exposure means to selectively discharge said photoreceptor in accordance with the original being copied to form a latent electrostatic image on the photoreceptor, and means to develop the latent electrostatic image, the developing means including at least one developer element adapted to bear an electrical bias, and voltage producing means for placing an electrical bias on said developer element, the combination of:

measuring means to determine the plate voltage on a test surface without contacting said test surface, said measuring means including a probe adapted for disposition adjacent said test surface, means to position said probe a preset distance from said test surface whereby said probe produces a signal reflecting the plate voltage of said test surface, and, means for coupling said test surface to said voltage producing means whereby to determine the voltage output of said voltage producing means with said measuring means, said probe positioning means being adapted to position said probe in preset spaced relationship with said photoreceptor whereby to permit voltages on said photoreceptor to be determined by said measuring means.

6. In an electrostatic reproduction machine for providing copies of originals including a movable photoreceptor, means to charge said photoreceptor in preparation for imaging, exposure means to selectively discharge said photoreceptor in accordance with the original being copied to form a latent electrostatic image on the photoreceptor, and means to develop the latent electrostatic image, the developing means including at least one developer element adapted to bear an electrical bias, and voltage producing means for placing an electrical bias on said developer element, the combination of:

measuring means to determine the plate voltage on a surface without contacting said surface, said measuring means including a probe adapted for disposition adjacent said surface, means to position said probe a preset distance from said surface whereby said probe produces a signal reflecting the plate voltage of said surface, means for coupling said surface to said voltage producing means whereby to determine the voltage output of said voltage producing means with said measuring means, said probe positioning means being adapted to position said probe in preset spaced relationship with said photoreceptor whereby to permit voltages on said photoreceptor to be determined by said measuring means, and means for supporting said surface in spaced juxtaposition with said photoreceptor and said probe positioning means whereby said probe positioning means is adapted selectively to locate said probe opposite either said photoreceptor or said surface.

7. The reproduction machine according to claim 6, in which said probe positioning means provides a supporting track along which said probe is adapted to move across the width of said photoreceptor whereby to permit said measuring means to sample voltages on said photoreceptor at selected points thereacross, said supporting track extending past said photoreceptor to said surface whereby to permit said probe to be moved opposite said surface for determining voltages thereon.

* * * * *